(12) United States Patent
Yeke Yazdandoost et al.

(10) Patent No.: US 10,474,867 B2
(45) Date of Patent: Nov. 12, 2019

(54) ELECTRONIC DEVICE INCLUDING MASK COLLIMATION AND RELATED METHODS

(71) Applicant: Apple Inc., Cupertino, CA (US)

(72) Inventors: Mohammad Yeke Yazdandoost, San Jose, CA (US); Giovanni Gozzini, Berkeley, CA (US)

(73) Assignee: APPLE INC., Cupertino, CA (US)

( * ) Notice: Subject to any disclaimer, the term of this patent is extended or adjusted under 35 U.S.C. 154(b) by 59 days.

(21) Appl. No.: 15/718,887

(22) Filed: Sep. 28, 2017

(65) Prior Publication Data
US 2019/0095672 A1    Mar. 28, 2019

(51) Int. Cl.
| | |
|---|---|
| G06K 9/00 | (2006.01) |
| H01L 27/146 | (2006.01) |
| H01L 51/52 | (2006.01) |
| H01L 27/32 | (2006.01) |
| H01L 51/56 | (2006.01) |
| H01L 27/12 | (2006.01) |

(52) U.S. Cl.
CPC ........ *G06K 9/0004* (2013.01); *H01L 27/1462* (2013.01); *H01L 27/14623* (2013.01); *H01L 27/14627* (2013.01); *H01L 27/14685* (2013.01); *H01L 27/3234* (2013.01); *H01L 51/5281* (2013.01); *H01L 51/56* (2013.01); *H01L 27/1214* (2013.01); *H01L 27/14678* (2013.01); *H01L 27/323* (2013.01)

(58) Field of Classification Search
CPC .................. G06K 9/0004; G06K 9/00013
See application file for complete search history.

(56) References Cited

U.S. PATENT DOCUMENTS

| | | | | |
|---|---|---|---|---|
| 2016/0041663 | A1* | 2/2016 | Chen | G06F 3/0412 345/174 |
| 2017/0286743 | A1* | 10/2017 | Lee | G02B 5/201 |
| 2018/0012069 | A1* | 1/2018 | Chung | A61B 5/1172 |
| 2018/0129798 | A1* | 5/2018 | He | G06K 9/00013 |
| 2018/0294247 | A1* | 10/2018 | Hung | H01L 27/14636 |
| 2019/0026522 | A1* | 1/2019 | Wang | G06K 9/0004 |
| 2019/0026527 | A1* | 1/2019 | He | G02B 6/0026 |

OTHER PUBLICATIONS

Yeke Yazdandoost et al., U.S. Appl. No. 15/718,828, filed Sep. 28, 2017.

* cited by examiner

*Primary Examiner* — Utpal D Shah
(74) *Attorney, Agent, or Firm* — Allen, Dyer, Doppelt + Gilchrist, P.A. Attorneys at Law

(57) ABSTRACT

An electronic device may include a substrate and a dielectric cover layer above the substrate. The electronic device may also include light emitting diodes (LEDs) carried by the substrate to direct light to the dielectric cover layer and optical image sensors carried by the substrate below the dielectric cover layer and adjacent the plurality of LEDs. Each optical image sensor may include at least one photodetector, a mask having at least one opening therein above the at least one photodetector, and an optical element above the mask and cooperating therewith to collimate light reflected from the dielectric cover layer to the at least one photodetector.

25 Claims, 15 Drawing Sheets

ELECTRONIC DEVICE INCLUDING MASK COLLIMATION AND RELATED METHODS

TECHNICAL FIELD

The present invention relates to the field of electronics, and, more particularly, to the field of optical image sensors.

BACKGROUND

Fingerprint sensing and matching is a reliable and widely used technique for personal identification or verification. In particular, a common approach to fingerprint identification involves scanning a sample fingerprint or an image thereof and storing the image and/or unique characteristics of the fingerprint image. The characteristics of a sample fingerprint may be compared to information for reference fingerprints already in a database to determine proper identification of a person, such as for verification purposes.

A fingerprint sensor may be particularly advantageous for verification and/or authentication in an electronic device, and more particularly, a portable device, for example. Such a fingerprint sensor may be carried by the housing of a portable electronic device, for example, and may be sized to sense a fingerprint from a single-finger.

Where a fingerprint sensor is integrated into an electronic device or host device, for example, as noted above, it may be desirable to more quickly perform authentication, particularly while performing another task or an application on the electronic device. In other words, in some instances it may be undesirable to have a user perform an authentication in a separate authentication step, for example switching between tasks to perform the authentication.

SUMMARY

An electronic device may include a substrate and a dielectric cover layer above the substrate. The electronic device may also include a plurality of light emitting diodes (LEDs) carried by the substrate to direct light to the dielectric cover layer and a plurality of optical image sensors carried by the substrate below the dielectric cover layer and adjacent the plurality of LEDs. Each optical image sensor may include at least one photodetector, a mask having at least one opening therein above the at least one photodetector, and an optical element above the mask and cooperating therewith to collimate light reflected from the dielectric cover layer to the at least one photodetector.

The optical element may include a microlens. The optical element may include another mask having at least one opening therein, for example.

Each optical image sensor may include a dielectric spacer carried above the mask. The dielectric spacer may include an optically transparent dielectric spacer, for example.

The plurality of LEDs may include a plurality of organic LEDs (OLEDs), for example. The electronic device may further include a polarizer layer above the plurality of optical image sensors and LEDs.

The substrate may include an interposer layer. The substrate may include a thin film transistor (TFT) layer, for example.

The electronic device may also include deblurring circuitry coupled to the plurality of optical image sensors. The mask may have a plurality of openings therein aligned with a given photodetector.

A method aspect is directed to a method of making an electronic device. The method may include providing a plurality of light emitting diodes (LEDs) on a substrate to direct light to a dielectric cover layer above the substrate. The method may also include providing a plurality of optical image sensors on the substrate adjacent the plurality of LEDs. Each optical image sensor may include at least one photodetector, a mask having at least one opening therein above the at least one photodetector, and an optical element above the mask and cooperating therewith so that light reflected from the dielectric cover layer is collimated to the at least one photodetector.

Another aspect is directed to an electronic device that may include a substrate, a dielectric cover layer above the substrate, and a plurality of light emitting diodes (LEDs) carried by the substrate. Each of the plurality of LEDs may be configured to operate as a light emitter in an illumination mode to direct light to the dielectric cover layer, and operate as a photodetector in an optical image sensing mode to sense optical images from an object adjacent the dielectric cover layer. The electronic device may further include deblurring circuitry coupled to the plurality of LEDs and configured to deblur the sensed optical images.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation is used to indicate similar elements in alternative embodiments.

Figures 1, 2:
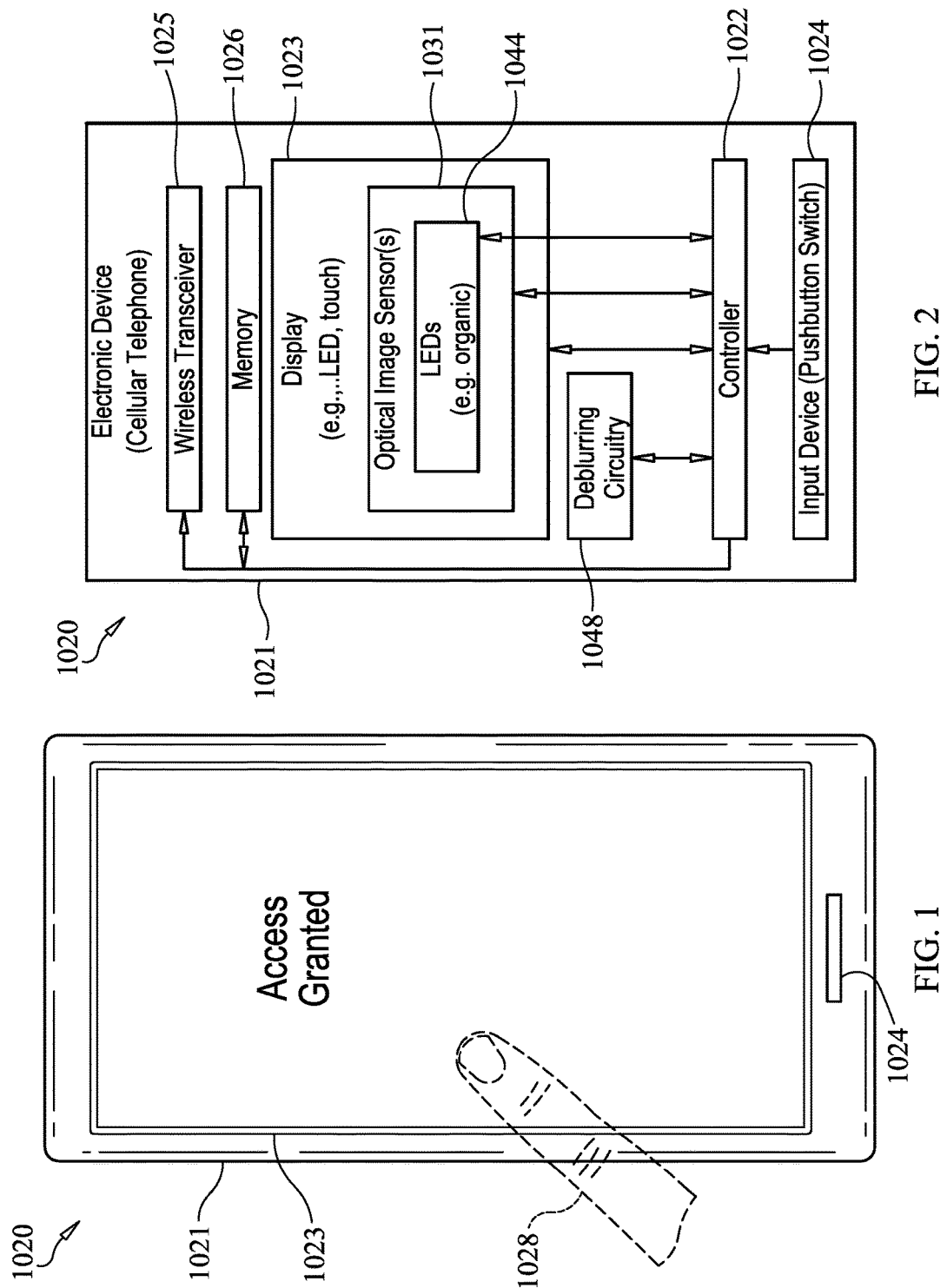
FIG. 1 is a plan view of an electronic device according to an embodiment.
FIG. 2 is a schematic block diagram of an electronic device of FIG. 1.

Referring initially to FIGS. 1-2, an electronic device 1020 illustratively includes a housing, for example, a portable housing 1021, and a controller 1022 carried by the portable housing. The electronic device 1020 is illustratively a mobile wireless communications device, for example, a cellular telephone. The electronic device 1020 may be another type of electronic device, for example, a tablet computer, laptop computer, wearable computer, etc.

A display 1023 is also carried by the portable housing 1021 and is coupled to the controller 1022. The display 1023 may be a light emitting diode (LED) display, for example, and may have additional circuitry to provide touch display features, as will be appreciated by those skilled in the art. Further details of the display 1023 are described below.

The wireless communications circuitry 1025 is also carried within the housing 1021 and coupled to the controller 1022. The wireless transceiver 1025 cooperates with the controller 1022 to perform at least one wireless communications function, for example, for voice and/or data. In some embodiments, the electronic device 1020 may not include a wireless transceiver 1025 or other wireless communications circuitry.

A memory 1026 is also coupled to the controller 1022. The memory 1026 is for storing biometric template data, for example. The memory 1026 may store other or additional types of data.

As will be appreciated by those skilled in the art, if the display 1023 is in the form of a touch display, the touch display may operate as both an input device and a display. As such, the display 1023 would cooperate with the controller 1022 to perform one or more device functions in response to input. For example, a device function may include a powering on or off of the electronic device 1020, initiating communication via the wireless transceiver 1025, and/or performing a menu function based upon input to the touch display.

The controller 1022 may change the display 1023 to show a menu of available applications based upon pressing or input to the touch display. Of course, other device functions may be performed based upon input to the touch display 1023. Other or additional finger-operated user input devices may be carried by the portable housing 1021, for example, a pushbutton switch 1024, which may alternatively or additionally be used for device functions as will be appreciated by those skilled in the art.

Figure 3:
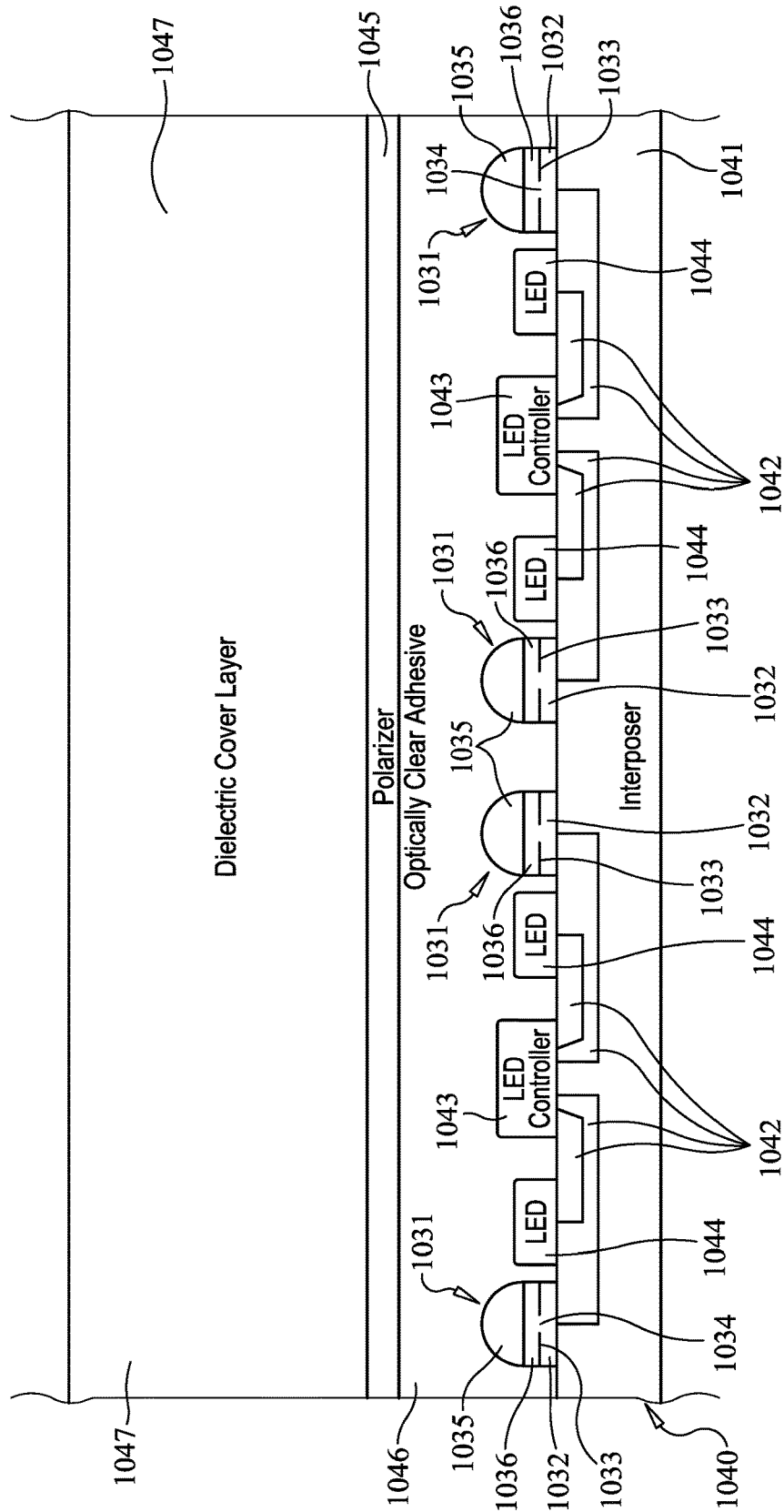
FIG. 3 is a more detailed schematic diagram of a portion of the electronic device of FIG. 2.
Figure 4:
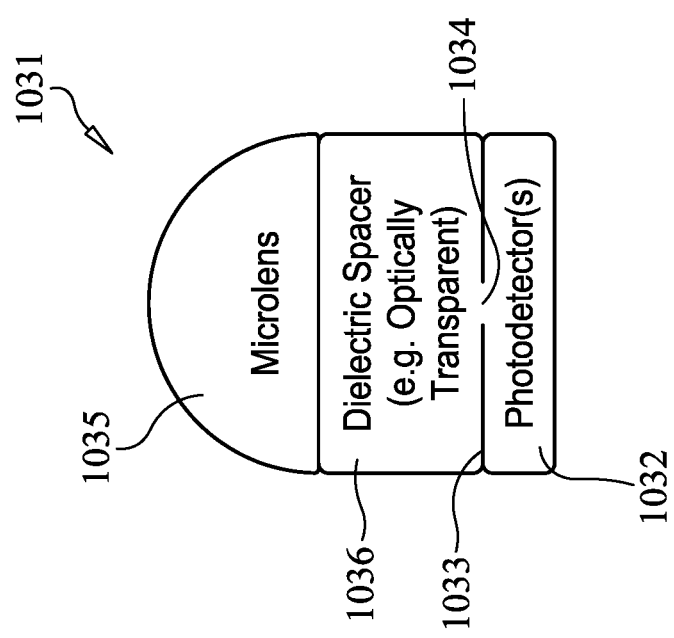
FIG. 4 is an enlarged schematic diagram of the optical image sensor of FIG. 3.

Referring now additionally to FIGS. 3 and 4, the electronic device 1020 may include a substrate 1040. The substrate may include an interposer layer 1041 and an interconnect layer 1042. Light emitting diode (LED) controller circuitry 1043 may be carried by the interconnect layer 1042.

LEDs 1044 are carried by the interconnect layer 1042 adjacent the LED controller circuitry 1043 and more particularly, laterally adjacent the LED controller circuitry. The LEDs 1044 direct light to a dielectric cover layer 1047 above the substrate 1040. The dielectric cover layer 1047, which may be optically transparent, defines a finger sensing surface that receives a user's finger 1028 adjacent thereto.

Optical image sensors 1031 are carried by the substrate 1040 below the dielectric cover layer 1047 and laterally adjacent the LEDs 1044 and LED controller circuitry 1043. Each optical image sensor 1031 illustratively includes a photodetector 1032, for example, a photodiode and a mask 1033 having an opening 1034 therein above the photodetector. More than one photodetector 1032 may be included in each optical image sensor 1031. The mask 1033 may have more than one opening 1034 therein.

The mask 1033 may be an opaque mask and the opening 1034 permits the passage of light therethrough. The mask 1033 is opaque, and thus does not permit light to pass through. The mask 1033 may include chromium, for example, a layer of chromium, to provide the opacity. Of course, other materials, may be used to provide opacity.

An optical element 1035, illustratively in the form of a microlens, is above the mask 1033 and cooperates therewith to collimate light reflected from the dielectric cover layer 1047 to the photodetector 1032. The microlens 1035 may have a thickness of about 1 micron, for example. An optically transparent dielectric spacer 1036 is between the microlens 1035 and the mask 1033.

An optically clear adhesive 1046 may be between the optical image sensors 1031 and the LEDs 1044. A polarizer layer 1045 is carried below the dielectric cover layer 1047, and more particularly, between the dielectric cover layer and the optical images sensors 1031 (i.e., above the optically clear adhesive 1046). Of course, other and/or additional layers may be included. The substrate 1040, the dielectric cover layer 1047, the LEDs 1044, the optical image sensors 1031, and the associated layers and components described above may be integrated into the display 1023. For example, the components described above may be part of the display.

The electronic device 1020 may also include deblurring circuitry 1048 (FIG. 2). As will be appreciated by those skilled in the art, using the known properties of the substrate 1040, the optical image sensors 1031, and the optically clear adhesive 1046, the angular behavior of the reflected light may be determined. Based upon the angular behavior, the deblurring circuitry 1048 may apply one or more deblurring algorithms, for example, based upon optical diffusion and having one or more diffusion coefficients.

Figure 5:
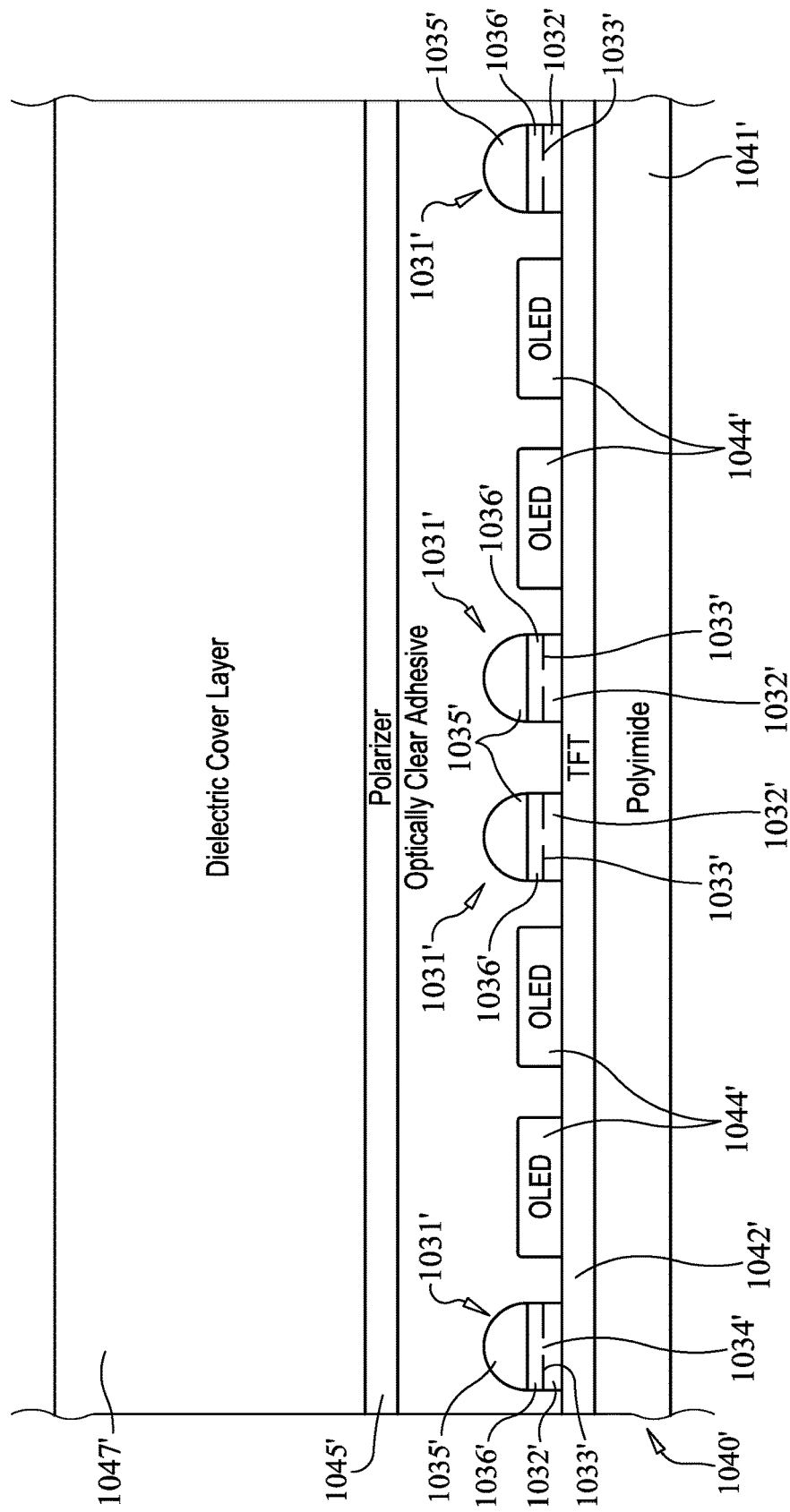
FIG. 5 is a detailed schematic diagram of a portion of an electronic device in accordance with another embodiment.
Figure 6:
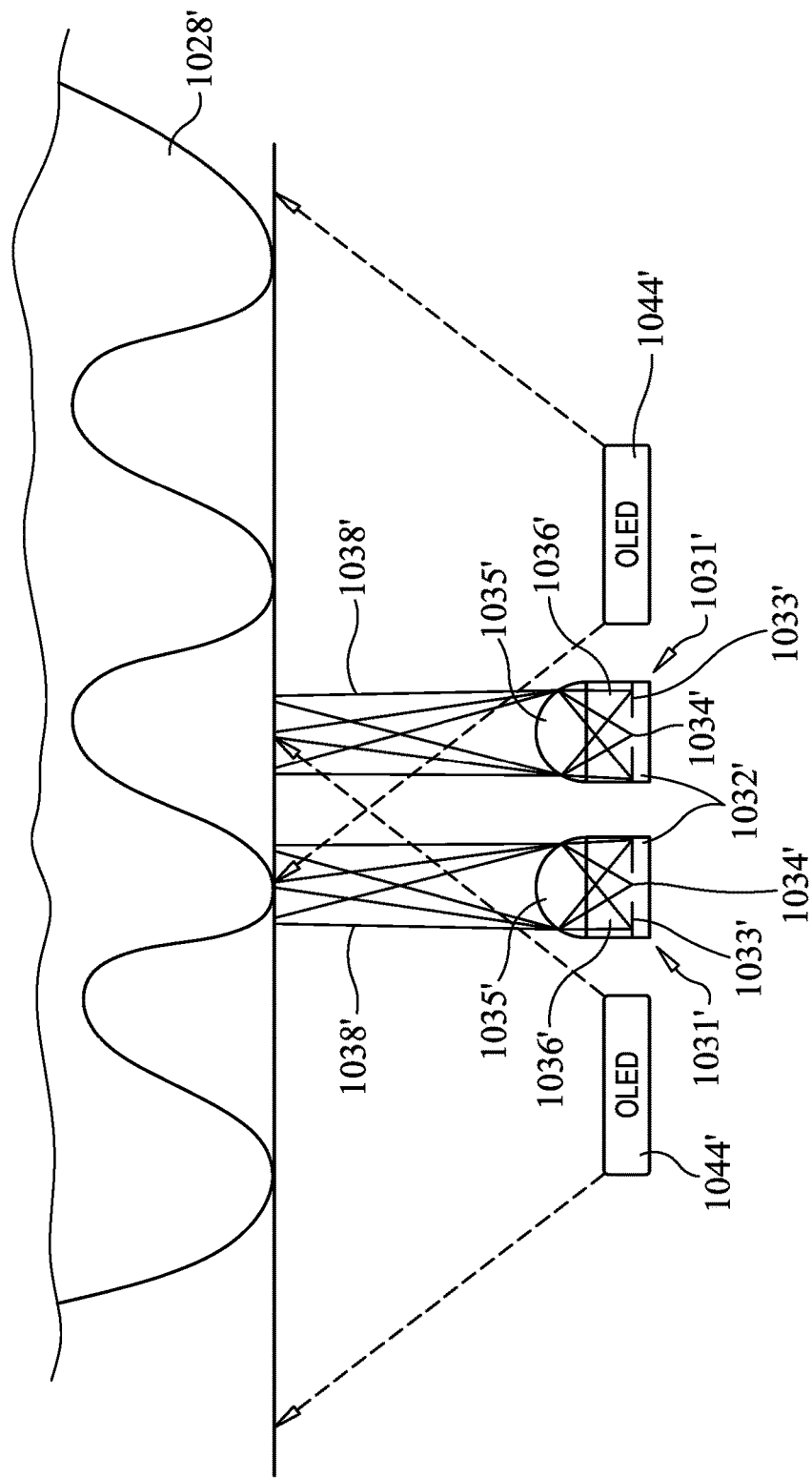
FIG. 6 is a diagram illustrating sensed field of view of the optical image sensor of FIG. 5.

Referring now to FIGS. 5 and 6, in another embodiment, the substrate 1040' may include a polyimide layer 1041' and a thin-film transistor (TFT) layer 1042' layer above the polyimide layer. Of course, other types of materials other than polyimide may be used. Organic LEDs (OLEDs) 1044' are carried by the substrate 1040' and more particularly, carried by the TFT layer 1042'. The OLEDs 1044' may not be organic in some embodiments. The TFT layer 1042' may have a height of about 2-3 microns, for example.

As will be appreciated by those skilled in the art and with reference to the embodiments described above, the field of view 1038' for each photodetector is limited to a relatively narrow angle by using the microlens 1035' and the mask 1033' (regardless of the type of substrate). This may advantageously permit collimation of the field of view 1038' such that each photodetector 1032' is imaging the information or reflected light from on top of itself.

Figure 7:
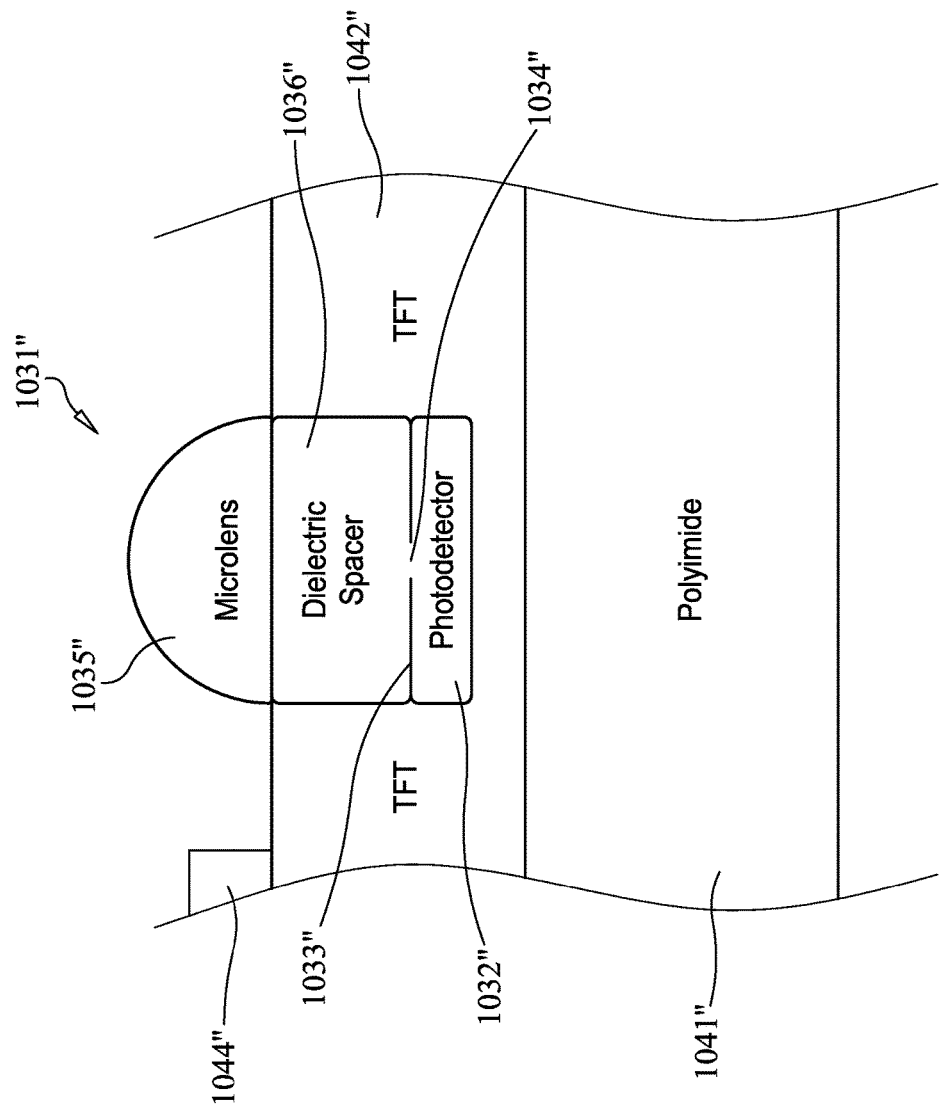
FIG. 7 is an enlarged schematic diagram illustrating an exemplary positioning of the optical image sensor of FIG. 5 in accordance with an embodiment.
Figure 8:
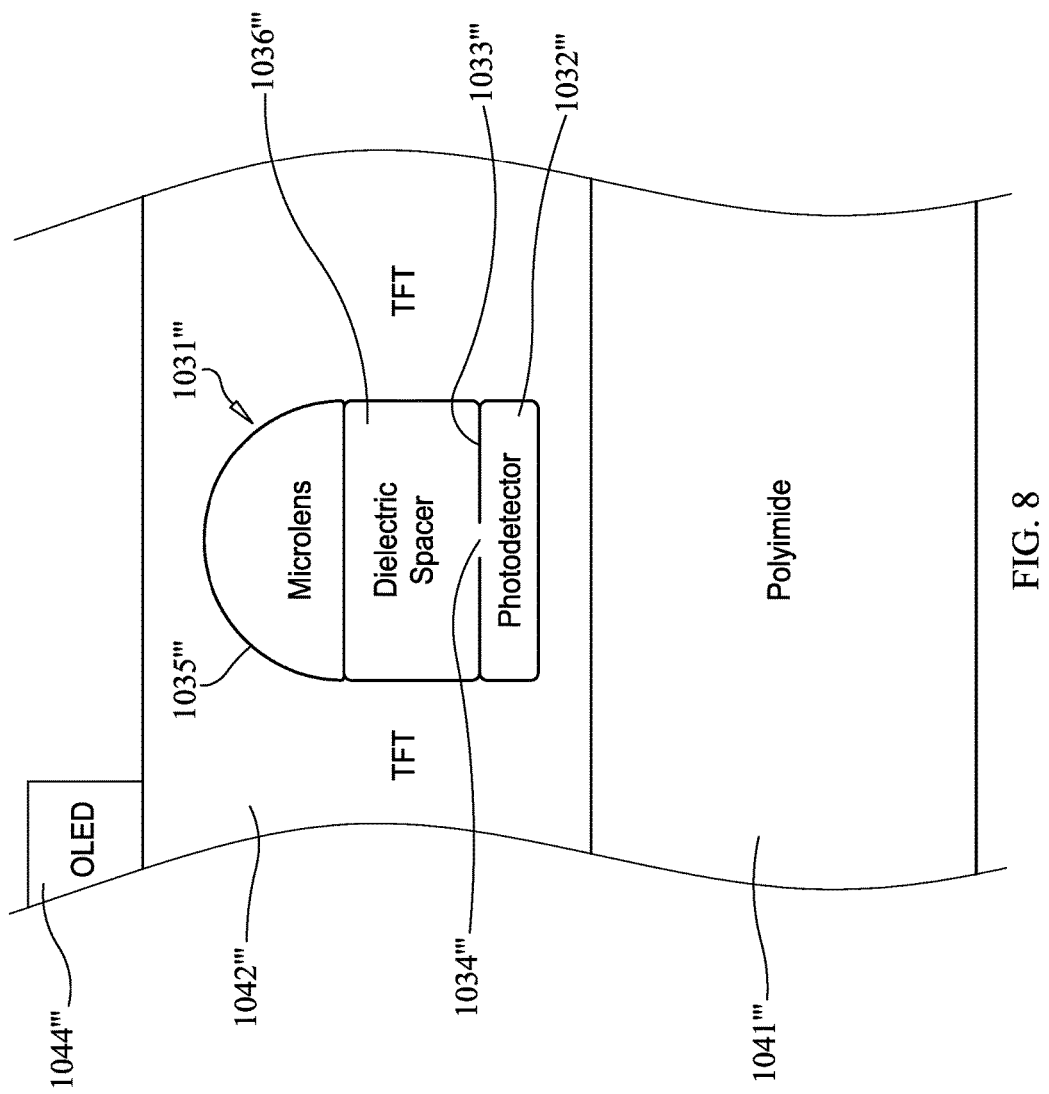
FIG. 8 is an enlarged schematic diagram illustrating an exemplary positioning of the optical image sensor of FIG. 5 in accordance with another embodiment.
Figure 9:
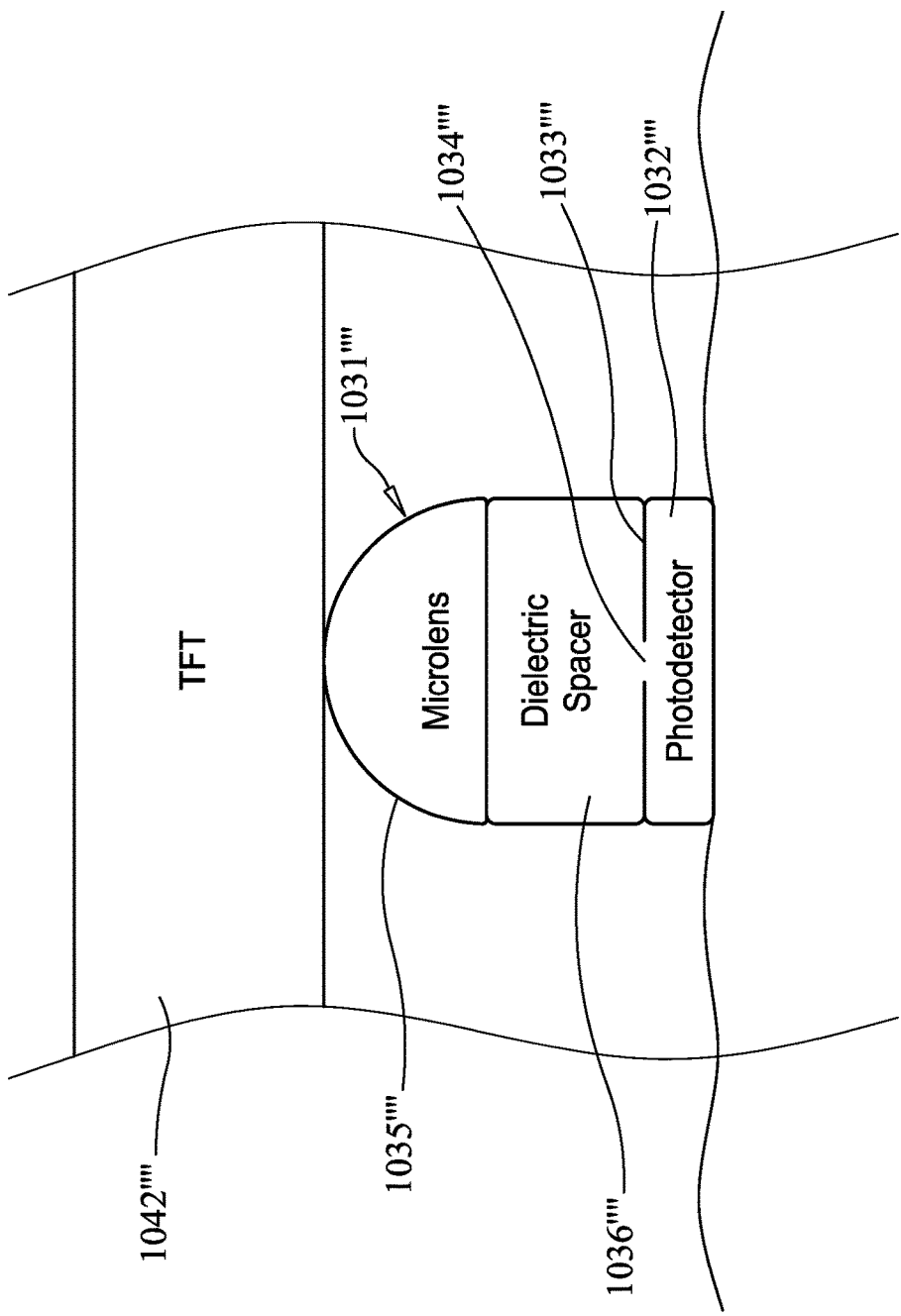
FIG. 9 is an enlarged schematic diagram illustrating an exemplary positioning of the optical image sensor of FIG. 5 in accordance with another embodiment.

Referring now to FIGS. 7-9, in other embodiments, the optical image sensors 1031, including the photodetector(s) 1032, mask 1033, and optical element 1035 may be carried by the substrate 1040 in other arrangements. In particular, the optical image sensors 1031 may be carried partially within the TFT layer 1042"(FIG. 7), within the TFT layer 1042''' (FIG. 8), or on the back side of (i.e., below) the TFT layer 1042'''' (FIG. 9). Elements illustrated in FIGS. 7-9 that are not specifically described are similar to those described above. Moreover, deblurring circuitry may also be used with any of the embodiments described with respect to FIGS. 5-9.

Each optical image sensor 1031 senses biometric image data associated with a user, such as, for example, data representative of a biometric image of the fingerprint patterns of the user's finger 1028. The controller 1022 may perform an authentication function by matching the acquired biometric image data to the stored biometric template data stored in the memory 1026, for example. The controller 1022 may perform and/or restrict functionality of the electronic device 1020 based upon the authentication as will be appreciated by those skilled in the art.

Figure 10:
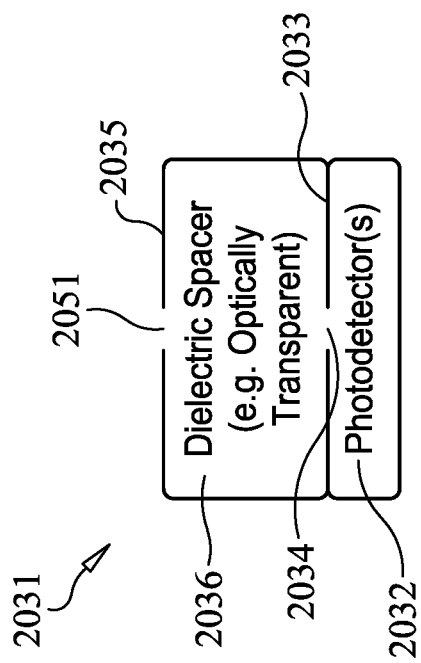
FIG. 10 is an enlarged schematic diagram of an optical image sensor in accordance with an embodiment.
Figure 11:
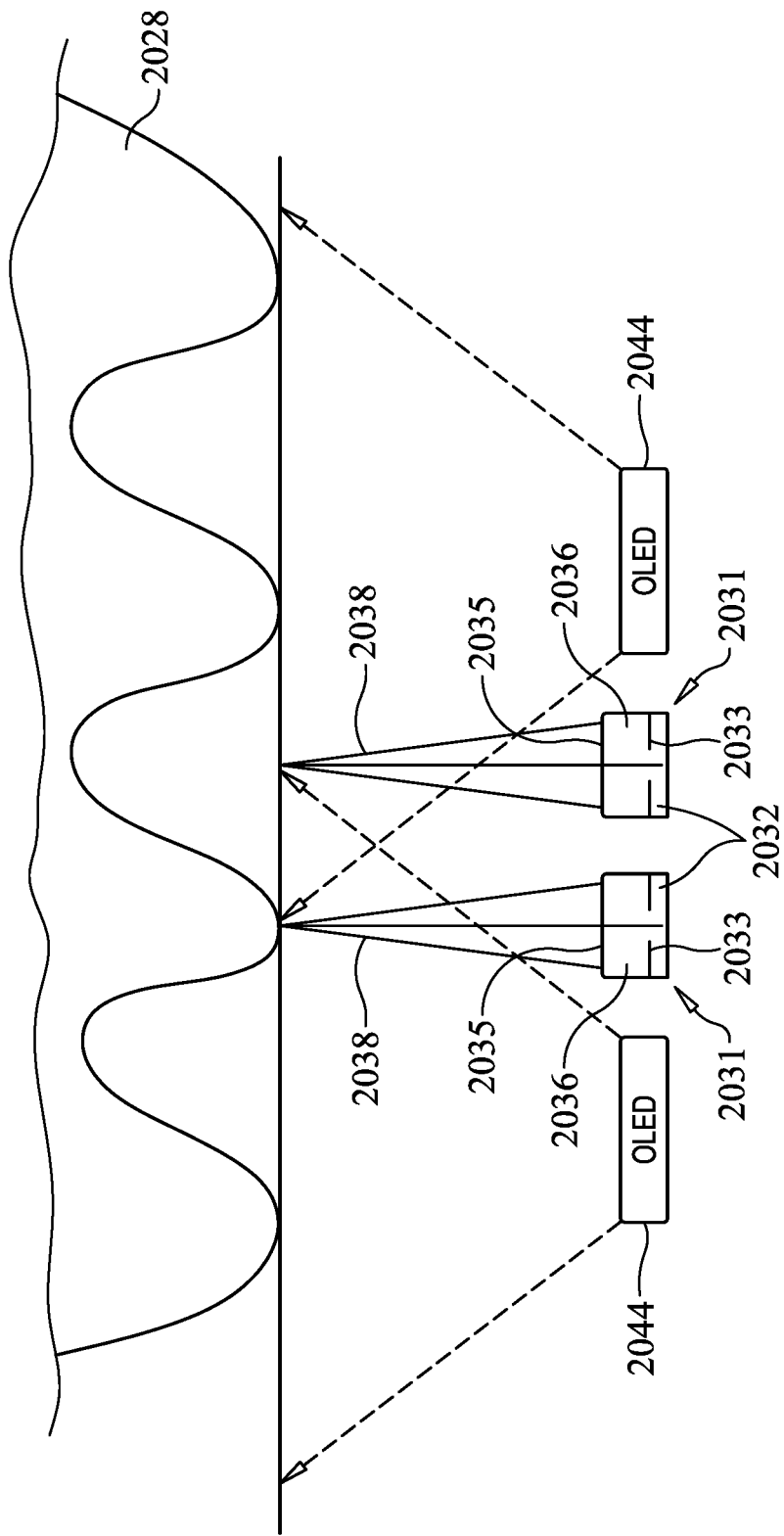
FIG. 11 is a diagram illustrating sensed field of view of the optical image sensor of FIG. 10.

Referring now to FIGS. 10 and 11, in another embodiment the optical element 2035 may be in the form of a second mask having an opening 2051 therein. In other words, instead of a microlens, each optical sensor 2031 includes a first mask 2033 above the photodetector 2032 and a second mask 2035 above the first mask and spaced from the first mask by a dielectric spacer 2036. The first and second masks 2033, 2035 may be embodied as metal layers to limit the field of view 2038. Of course, more than two masks may (e.g., metal layers) may be used to achieve desired limiting of the field of view 2038.

Figure 12:
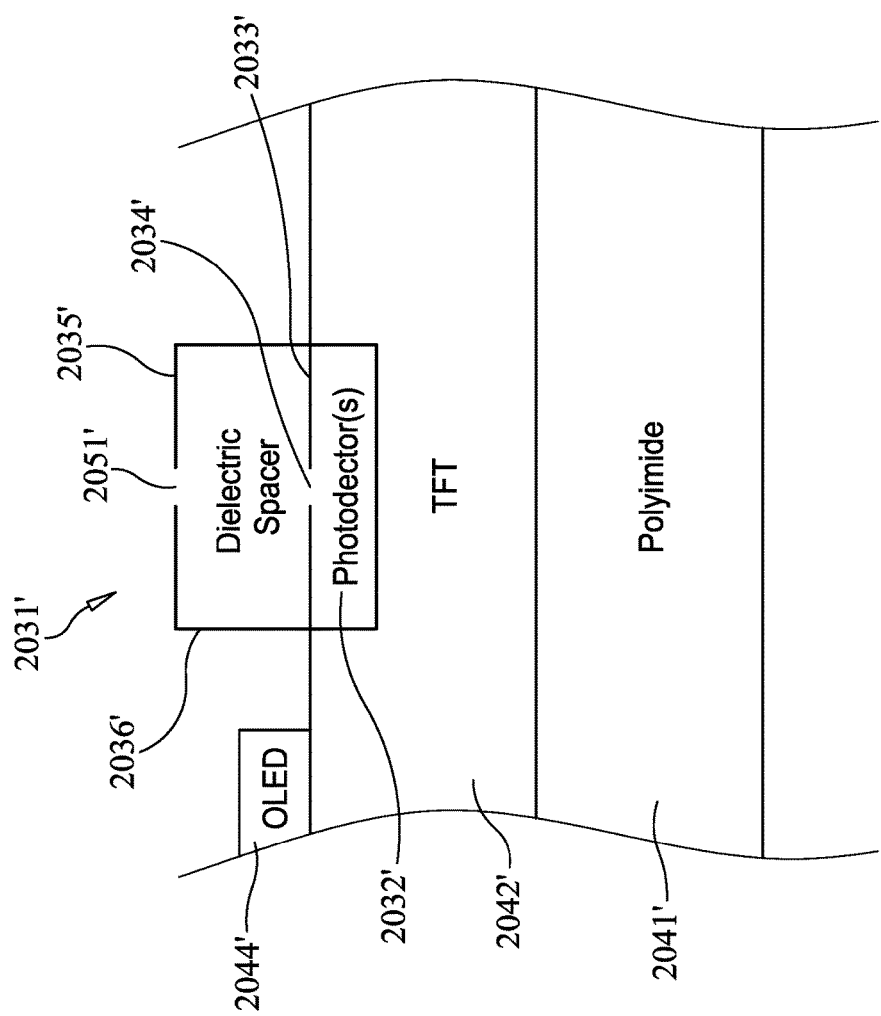
FIG. 12 is an enlarged schematic diagram illustrating an exemplary positioning of the optical image sensor of FIG. 10 in accordance with an embodiment.
Figure 13:
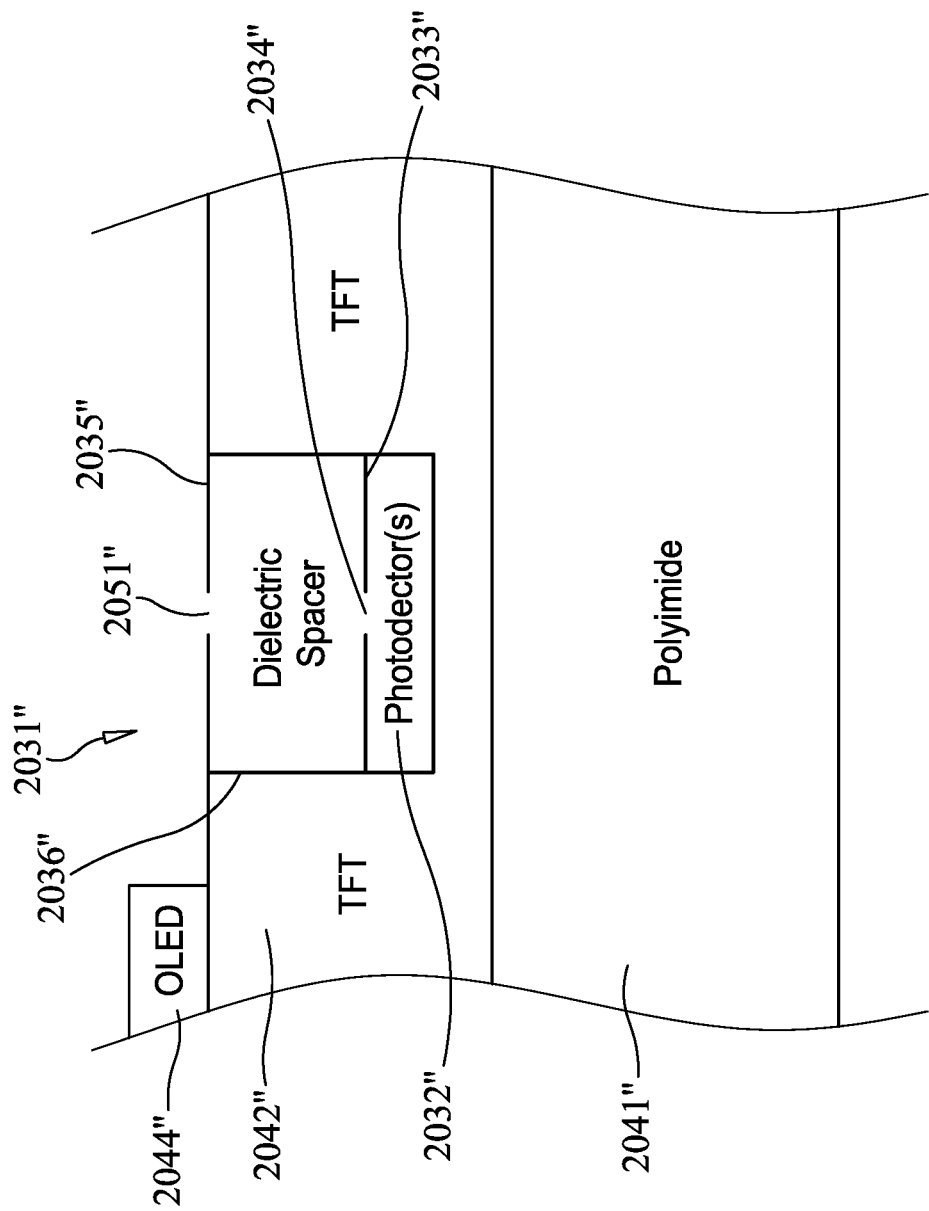
FIG. 13 is an enlarged schematic diagram illustrating an exemplary positioning of the optical image sensor of FIG. 10 in accordance with another embodiment.
Figure 14:
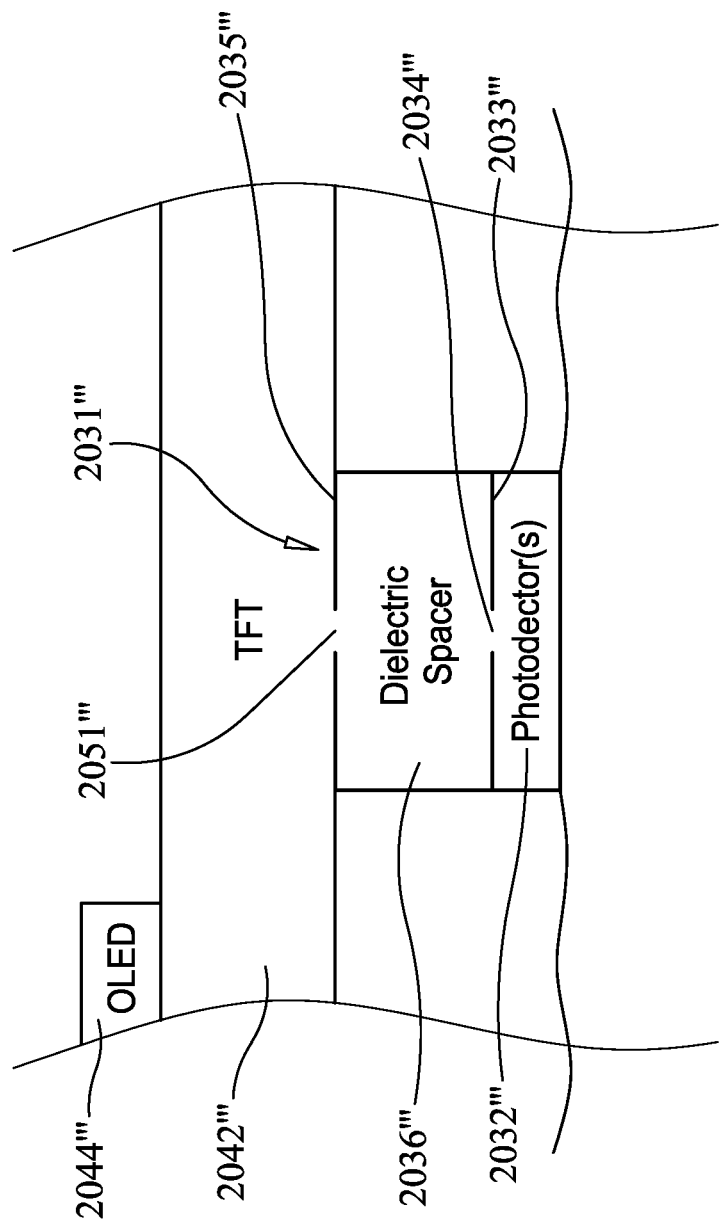
FIG. 14 is an enlarged schematic diagram illustrating an exemplary positioning of the optical image sensor of FIG. 10 in accordance with another embodiment.

Similar to the embodiments described above, the optical image sensors 2031, including the photodetector(s) 2032, and first and second masks 2033, 2035 may carried by the substrate 2040 in other arrangements. In particular, the optical image sensors 2031 may be carried partially within the TFT layer 2042'(FIG. 12), within the TFT layer 2042'' (FIG. 13), or on the back side of (i.e., below) the TFT layer 2042''' (FIG. 14). Elements illustrated in FIGS. 12-14 that are not specifically described are similar to those described above. Moreover, deblurring circuitry may also be used with any of the embodiments described with respect to FIGS. 10-14.

Figure 16:
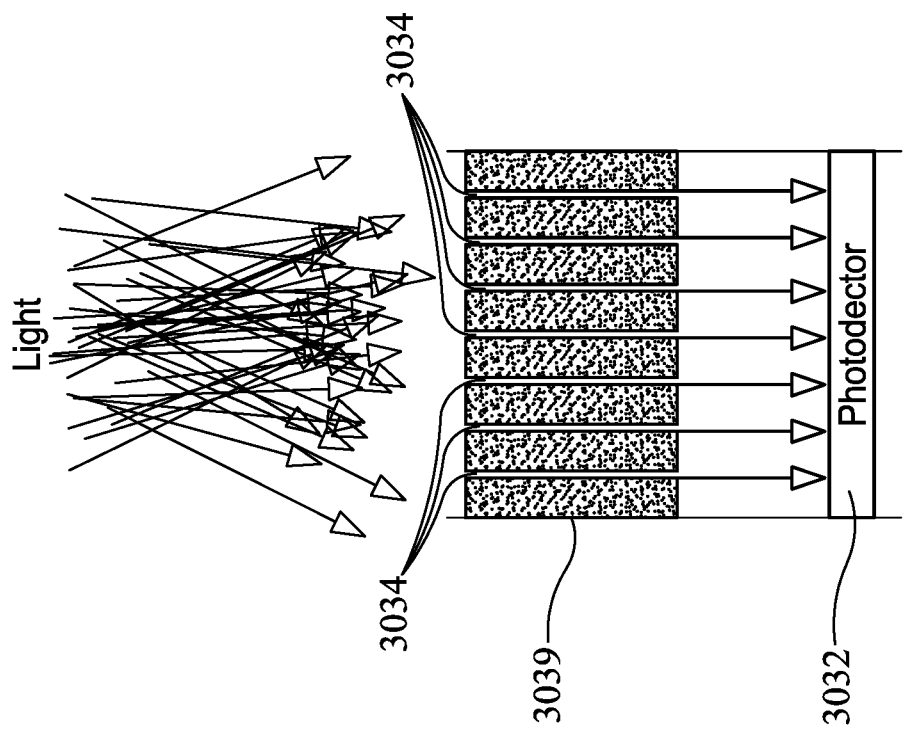
FIG. 16 is a diagram illustrating sensed illumination of the optical image sensor of FIG. 15.
Figure 15:
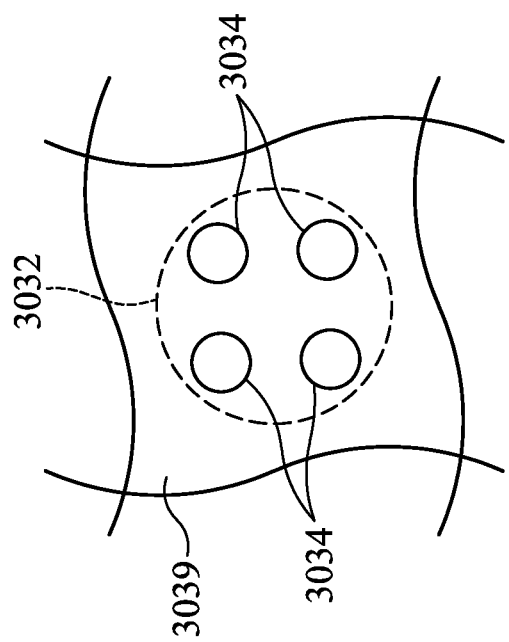
FIG. 15 is a schematic diagram of a portion of an optical image sensor in accordance with another embodiment.

Referring briefly to FIGS. 15 and 16, in another embodiment, a mesh grid 3039 defining the mask may be carried above the photodetectors 3032. The mesh grid 3039 may permit implementation of smaller or multiple openings 3034 per photodetector or photodiode 3032.

The arrangement of the optical image sensors 1031 and the LEDs 1044 may be particularly advantageous for multiple applications, for example, fingerprint sensing, optical touch sensing, and/or heart rate sensing (e.g., if the LEDs are infrared (IR), near infrared (NIR), and/or ambient light sensing (ALS). Additionally, the IR-cut filter can be below or on top of the optically transparent dielectric spacer 1036 to permit fingerprint sensing below direct sunlight, for example.

A method aspect is directed to a method of making an electronic device 1020. The method includes providing a plurality of light emitting diodes (LEDs) 1044 on a substrate 1040 to direct light to a dielectric cover layer 1047 above the substrate. The method also includes providing a plurality of optical image sensors 1031 on the substrate 1040 adjacent the plurality of LEDs 1044. Each optical image sensor 1031 may include at least one photodetector 1032, a mask 1033 above the at least one photodetector, and an optical element 1035 above the mask and cooperating therewith so that light reflected from the dielectric cover layer 1047 is collimated to the at least one photodetector.

Figure 17:
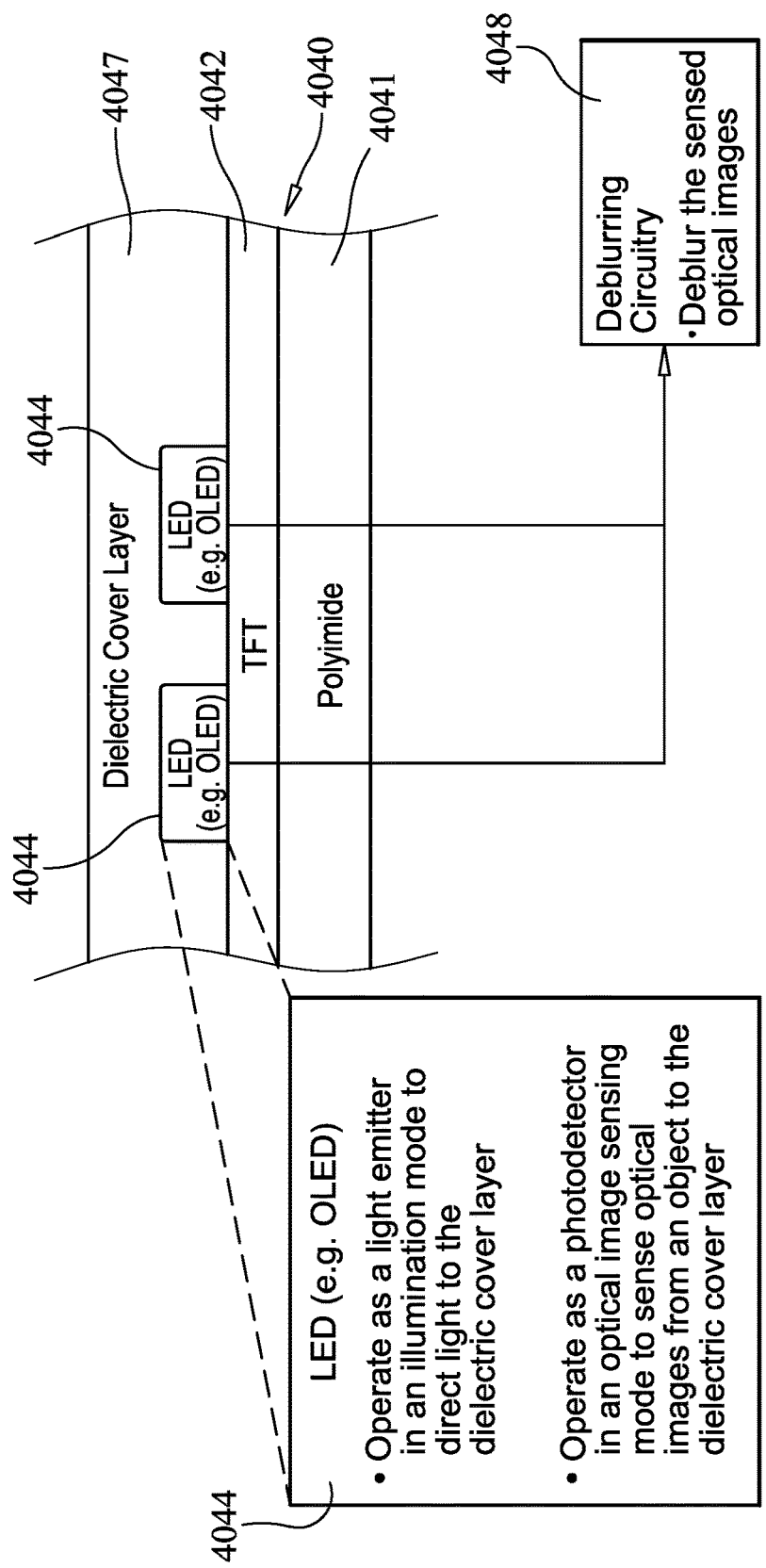
FIG. 17 is a schematic diagram of a portion of an electronic device in accordance with another embodiment.

Referring now to FIG. 17, in another embodiment, as stackable organic layers, the OLEDs 4044 may be operated as photodetectors. The present embodiment may be particularly desirable when, for example, the dielectric cover layer 4047 is relatively thin. In other words, the OLEDs 4044 may be used to direct light to the dielectric cover layer 4047 and also to sense an optical image. In some embodiments, the OLEDs 4044 may not be organic LEDs. In this embodiment, it may be desirable to not use a microlens or mask, but instead the deblurring circuitry 4048. Accordingly, a corresponding electronic device illustratively includes a substrate 4040, a dielectric cover layer 4047 above the substrate, and LEDs 4044 carried by the substrate. The substrate 4040 may include a TFT layer 4042 carried by a polyimide layer 4041. However, any of the above-described substrates and/or other types of substrates may be used. Additionally, the electronic device 4020 may include other and/or additional layers or elements, for example, as described in any of the above embodiments. Still further, each of the LEDs 4044 may be carried by, partially within, below, or on a backside of the TFT layer 4042.

Each of the LEDs 4044 operates as a light emitter in an illumination mode to direct light to the dielectric cover layer 4047, and operates as a photodetector in an optical image sensing mode to sense optical images from an object adjacent the dielectric cover layer. The deblurring circuitry 4048 is coupled to the plurality of LEDs 4044 to deblur the sensed optical images. In some embodiments, separate LEDs 4044 may perform respective illumination and sensing functions. Control circuitry may be coupled to the LEDs 4044 to control operation of the LEDs, for example, to switch the LEDs between modes.

The benefits of biometric data collected by a device as disclosed herein include convenient access to device features without the use of passwords. In other examples, user biometric data is collected for providing users with feedback about their health or fitness levels. The present disclosure further contemplates other uses for personal information data, including biometric data, that benefit the user of such a device.

Practicing the present invention requires that collecting, transferring, storing, or analyzing user data, including personal information, will comply with established privacy policies and practices. In particular, such entities should implement and consistently use privacy policies and practices that are generally recognized as meeting or exceeding industry or governmental requirements for maintaining personal information data private and secure, including the use of data encryption and security methods that meets or exceeds industry or government standards. Personal information from users should not be shared or sold outside of legitimate and reasonable uses. Further, such collection should occur only after receiving the informed consent of the users. Additionally, such entities would take any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices.

The present disclosure also contemplates the selective blocking of access to, or use of, personal information data, including biometric data. Hardware and/or software elements disclosed herein can be configured to prevent or block access to such personal information data. Optionally allowing users to bypass biometric authentication steps by providing secure information such as passwords, personal identification numbers (PINS), touch gestures, or other authentication methods, alone or in combination, is well known to those of skill in the art. Users can further select to remove, disable, or restrict access to certain health-related applications collecting users' personal health or fitness data.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   a substrate;
   a dielectric cover layer above the substrate;
   a plurality of light emitting diodes (LEDs) carried by the substrate to direct light to the dielectric cover layer; and
   a plurality of optical image sensors carried by the substrate below the dielectric cover layer and adjacent the plurality of LEDs, each optical image sensor comprising
      a plurality of photodetectors,
      a mesh grid defining a mask having a plurality of openings therein, each of the plurality of photodetectors being aligned with respective openings of the plurality of openings, and
      an optical element above the mask and cooperating therewith to collimate light reflected from the dielectric cover layer to the plurality of photodetectors.

2. The electronic device of claim 1 wherein the optical element comprises a microlens.

3. The electronic device of claim 1 wherein the optical element comprises another mask having at least one opening therein.

4. The electronic device of claim 1 wherein each optical image sensor comprises a dielectric spacer carried above the mask.

5. The electronic device of claim 4 wherein the dielectric spacer comprises an optically transparent dielectric spacer.

6. The electronic device of claim 1 wherein the plurality of LEDs comprise a plurality of organic LEDs (OLEDs).

7. The electronic device of claim 1 further comprising a polarizer layer above the plurality of optical image sensors and LEDs.

8. The electronic device of claim 1 wherein the substrate comprises an interposer layer.

9. The electronic device of claim 1 wherein the substrate comprises a thin film transistor (TFT) layer.

10. The electronic device of claim 1 further comprising deblurring circuitry coupled to the plurality of optical image sensors.

11. An electronic device comprising:
    a housing;
    wireless communications circuitry carried by the housing;
    a biometric sensor carried by the housing and comprising
       a substrate,
       a dielectric cover layer above the substrate defining a finger sensing surface,
       a plurality of light emitting diodes (LEDs) carried by the substrate to direct light to the dielectric cover layer, and
       a plurality of optical image sensors carried by the substrate below the dielectric cover layer and adjacent the plurality of LEDs, each optical image sensor comprising
          a plurality of photodetectors,
          a mesh grid defining a mask having a plurality of openings therein, the plurality of photodetectors being aligned with respective openings of the plurality of openings, and
          an optical element above the mask and cooperating therewith to collimate light reflected from the dielectric cover layer to the plurality of photodetectors; and
    a controller configured to cooperate with wireless communications circuitry and the biometric sensor to perform at least one wireless communications function and biometric sensing function, respectively.

12. The electronic device of claim 11 wherein the optical element comprises a microlens.

13. The electronic device of claim 11 wherein the optical element comprises another mask having at least one opening therein.

14. The electronic device of claim 11 wherein each optical image sensor comprises a dielectric spacer carried above the mask.

15. The electronic device of claim 11 wherein the plurality of LEDs comprise a plurality of organic LEDs (OLEDs).

16. A method of making an electronic device comprising:
    providing a plurality of light emitting diodes (LEDs) on a substrate to direct light to a dielectric cover layer above the substrate; and
    providing a plurality of optical image sensors on the substrate adjacent the plurality of LEDs, each optical image sensor comprising a plurality of photodetectors, a mesh grid defining a mask having a plurality of openings therein, the plurality of photodetectors being aligned with respective openings of the plurality of openings, and an optical element above the mask and cooperating therewith so that light reflected from the dielectric cover layer is collimated to the plurality of photodetectors.

17. The method of claim 16 wherein the optical element comprises a microlens.

18. The method of claim 16 wherein the optical element comprises another mask having at least one opening therein.

19. The method of claim 16 wherein each optical image sensor comprises a dielectric spacer carried above the mask.

20. The method of claim 19 wherein the dielectric spacer comprises an optically transparent dielectric spacer.

21. The method of claim 16 wherein the plurality of LEDs comprise a plurality of organic LEDs (OLEDs).

22. The method of claim 16 further comprising positioning a polarizer layer above the plurality of optical image sensors and LEDs.

23. An electronic device comprising:
    a substrate;
    a dielectric cover layer above the substrate;
    a plurality of light emitting diodes (LEDs) carried by the substrate, each of the plurality of LEDs being configured to
       operate as a light emitter in an illumination mode to direct light to the dielectric cover layer, and
       operate as a photodetector in an optical image sensing mode to sense optical images from an object adjacent the dielectric cover layer; and
    deblurring circuitry coupled to the plurality of LEDs and configured to deblur the sensed optical images.

24. The electronic device of claim 23 wherein the plurality of LEDs comprises a plurality of organic LEDs (OLEDs).

25. The electronic device of claim 23 wherein the substrate comprises a thin film transistor (TFT) layer.

* * * * *